United States Patent
Lee et al.

(10) Patent No.: US 9,099,569 B2
(45) Date of Patent: Aug. 4, 2015

(54) MEMS MICROPHONE

(71) Applicant: BSE CO., LTD., Incheon (KR)

(72) Inventors: Sang Ho Lee, Incheon (KR); Yong Hyun Shim, Incheon (KR)

(73) Assignee: BSE CO., LTD., Incheon (KR)

( * ) Notice: Subject to any disclaimer, the term of this patent is extended or adjusted under 35 U.S.C. 154(b) by 0 days.

(21) Appl. No.: 14/261,633

(22) Filed: Apr. 25, 2014

(65) Prior Publication Data

US 2015/0001648 A1 Jan. 1, 2015

(30) Foreign Application Priority Data

Jun. 27, 2013 (KR) .......................... 10-2013-0074918

(51) Int. Cl.
| | |
|---|---|
| *H01L 29/84* | (2006.01) |
| *H04R 19/04* | (2006.01) |
| *B81B 3/00* | (2006.01) |
| *B81B 7/00* | (2006.01) |

(52) U.S. Cl.
CPC .............. *H01L 29/84* (2013.01); *B81B 3/0021* (2013.01); *B81B 7/0032* (2013.01); *B81B 7/0035* (2013.01); *B81B 7/0061* (2013.01); *H04R 19/04* (2013.01); *H04R 2201/003* (2013.01)

(58) Field of Classification Search
CPC .... H01L 29/84; B81B 7/0061; B81B 7/0035; B81B 7/0032
See application file for complete search history.

(56) References Cited

U.S. PATENT DOCUMENTS

| | | |
|---|---|---|
| 2009/0074222 A1 | 3/2009 | Song |
| 2009/0180655 A1 | 7/2009 | Tien et al. |
| 2010/0080405 A1 | 4/2010 | Wu et al. |
| 2010/0142742 A1 | 6/2010 | Tanaka et al. |
| 2010/0272302 A1* | 10/2010 | Feiertag et al. ............... 381/361 |
| 2010/0295139 A1* | 11/2010 | Ly et al. ......................... 257/416 |
| 2011/0158449 A1* | 6/2011 | Tanaka et al. ................. 381/355 |
| 2011/0158453 A1* | 6/2011 | Tanaka et al. ................. 381/361 |
| 2011/0235841 A1 | 9/2011 | Tanaka et al. |

(Continued)

FOREIGN PATENT DOCUMENTS

| | | |
|---|---|---|
| JP | 2010-104006 A | 5/2010 |
| JP | 2010-136133 A | 6/2010 |

(Continued)

OTHER PUBLICATIONS

KIPO Report of Prior Art Search (2013).*

(Continued)

*Primary Examiner* — Michele Fan
(74) *Attorney, Agent, or Firm* — Ladas & Parry LLP

(57) ABSTRACT

A micro-electro mechanical system (MEMS) microphone includes: a printed circuit substrate; a MEMS chip that is combined with the printed circuit substrate and has a MEMS inner space; and a case that is combined with the printed circuit substrate, accommodates the MEMS chip, and forms an inner space that is separated from an external space, wherein the case is a double-type case including an inner case and an outer case, a medium acoustic path space is formed between the inner case and the outer case, and the printed circuit substrate includes a substrate acoustic path that connects the medium acoustic path space to the MEMS inner space of the MEMS chip so that external sound passing through the sound hole enters the MEMS inner space of the MEMS chip after passing through the medium acoustic path space.

7 Claims, 6 Drawing Sheets

(56) References Cited

U.S. PATENT DOCUMENTS

| | | | |
|---|---|---|---|
| 2012/0020510 A1* | 1/2012 | Tanaka et al. | 381/337 |
| 2012/0243721 A1* | 9/2012 | Inoda et al. | 381/365 |
| 2012/0257777 A1* | 10/2012 | Tanaka et al. | 381/355 |
| 2012/0300969 A1* | 11/2012 | Tanaka et al. | 381/355 |
| 2013/0069180 A1* | 3/2013 | Umeda et al. | 257/416 |
| 2013/0070951 A1* | 3/2013 | Tanaka et al. | 381/361 |
| 2013/0136291 A1* | 5/2013 | Lee et al. | 381/355 |
| 2013/0163790 A1* | 6/2013 | Shimizu et al. | 381/122 |
| 2013/0241045 A1 | 9/2013 | Goida et al. | |
| 2014/0226836 A1* | 8/2014 | Miyatake | 381/94.1 |
| 2014/0233756 A1* | 8/2014 | Inoda | 381/91 |

FOREIGN PATENT DOCUMENTS

| | | |
|---|---|---|
| JP | 2010/106733 A1 | 9/2010 |
| JP | 2011-124748 A | 6/2011 |
| KR | 1020080005801 A | 1/2008 |
| KR | 1020110137559 A | 12/2011 |
| WO | 20122114536 A1 | 8/2012 |

OTHER PUBLICATIONS

Korean Notice of Allowance dated Dec. 2, 2013; Appln. No. 10-2013-0074918.

* cited by examiner

MEMS MICROPHONE

RELATED APPLICATIONS

This application claims the benefit of Korean Patent Application No. 10-2013-0074918, filed on Jun. 27, 2013, in the Korean Intellectual Property Office, the disclosure of which is incorporated herein in its entirety by reference.

BACKGROUND

1. Field

One or more embodiments of the present invention relate to a micro-electro mechanical system (MEMS) microphone, and more particularly, to a MEMS microphone that has increased acoustic characteristics by providing a sufficient back-chamber space.

2. Description of the Related Art

A microphone is essentially used in a mobile communication terminal. A conventional condenser microphone includes a diaphragm, a back plate, and a junction gate field effect transistor (JFET). The diaphragm and back plate form a capacitor C of which capacitance changes according to a sound pressure, and the JFET buffers an output signal.

The manufacture of the conventional condenser microphone is formed as a single assembly by bending an edge portion of a case towards a printed circuit substrate after sequentially inserting a vibrating plate (the diaphragm), a spacer ring, an insulating ring, the back plate, a current application ring, and finally the printed circuit substrate on which circuit parts are mounted in the single case.

Recently, a semiconductor processing technique that uses a micromachining technique to which a semiconductor process, in particular, an integration technique is applied has been used as a technique for integrating minute devices on a microphone. This technique that is referred to as a micro-electro mechanical system (MEMS) is used for manufacturing an ultra-small sensor or actuator and an electro-mechanical structure of μm unit.

A MEMS microphone manufactured by using the micromachining technique is manufactured by miniaturizing, increasing the performance, multifunctionalizing, and integrating the conventional microphone parts, such as the vibrating plate, the spacer ring, the insulating ring, the back plate, and the current application ring through a super-precision minute processing. Thus, the stability and reliability of the MEMS microphone may increase.

FIG. 1 is a schematic cross-sectional view of a related-art MEMS microphone 100 having a MEMS chip 120. The MEMS microphone 100 includes a printed circuit substrate 110, the MEMS chip 120 mounted on the printed circuit substrate 110, an application-specific integrated circuit (ASIC) chip 130 that is referred to as an amplifier, and a case 150 having a sound hole 140.

In this configuration, a space formed in the MEMS is referred to as a MEMS inner space 126. In the case of the MEMS microphone 100 in which the sound hole 140 is formed in the case 150, the MEMS inner space 126 is a back chamber. The back chamber is a space for circulating air generated when a vibrating plate vibrates, that is, a space for preventing an acoustic resistance. That is, the space referred to as the back chamber denotes a space located on a side opposite to the side through which an external sound enters with the vibrating plate as a center. As the size of the back chamber increases, the sensitivity and signal to noise ratio (SNR) of the MEMS microphone 100 increase, and thus, the performance of the MEMS microphone 100 increases.

FIG. 2 is a schematic cross-sectional view of another related-art MEMS microphone 102 in which a sound hole 140 is formed in a printed circuit substrate 110 instead of a case 150. No through hole is formed in the case 150. External sound enters through the sound hole 140 formed in the printed circuit substrate 110. In this case, the back chamber is not an inner space of the MEMS microphone 102, but an inner space 151 of the case 150 functions as a back chamber.

In the case of the MEMS microphone 102, since the inner space 151 of the case 150 is the back chamber, the back chamber is quite large. However, in the MEMS microphone 100 of FIG. 1, since the MEMS inner space 126 is the back chamber, the back chamber is very small.

In this case, the SNR of the MEMS microphone 100 is small, and thus, the acoustic quality of the MEMS microphone 100 is reduced.

REFERENCE LITERATURE

Patent

Patent Publication No. 2008-0005801

SUMMARY

One or more embodiments of the present invention include a MEMS microphone that has increased acoustic characteristics by providing a sufficient back-chamber space.

One or more embodiments of the present invention include a MEMS microphone that may be assembled by a simple assembling process while providing a sufficient back-chamber space.

Additional aspects will be set forth in part in the description which follows and, in part, will be apparent from the description, or may be learned by practice of the presented embodiments.

According to one or more embodiments of the present invention, a micro-electro mechanical system (MEMS) microphone including: a printed circuit substrate; a MEMS chip that is combined with the printed circuit substrate and has a MEMS inner space; and a case that is combined with the printed circuit substrate, accommodates the MEMS chip, and forms an inner space that is separated from an external space, wherein the case includes an inner case and an outer case, the inner space is formed by combining a lower edge of the inner case with the printed circuit substrate, the outer case is formed to surround the inner case at an outside of the inner space, a lower edge thereof is combined with the printed circuit substrate so that a medium acoustic path space is formed between the inner case and the outer case, and includes a sound hole so that external sound enters the medium acoustic path space, and the printed circuit substrate includes a substrate acoustic path that connects the medium acoustic path space to the MEMS inner space of the MEMS chip so that the external sound that passes through the sound hole enters the MEMS inner space of the MEMS chip after passing through the medium acoustic path space.

Both the inner case and the outer case may be formed of a metal.

Lower surfaces of the inner case and the outer case may be combined with the printed circuit substrate by a conductive adhesive.

The inner case may be fixed in an inner space of the outer case by a forcibly fixing method.

The inner case may be fixed by being inserted in an inner space of the outer case, an outer surface of the inner case forms a surface contact with an inner surface of the outer case, and a portion of the outer surface of the inner case is separated from the inner surface of the outer case to form the medium acoustic path space.

The outer case may include four sidewalls and an upper wall, the inner case includes four sidewalls and an upper wall, a groove unit is formed in the outer surface of the upper wall to be connected to the sound hole, some portions of the four sidewalls are removed to form a barrier wall and an up-and-down path is formed along the removed portions, and the medium acoustic path space is formed by combining the groove unit with the up-and-down path.

The outer case may include four sidewalls and an upper wall, the inner case includes four sidewalls and an upper wall, an upper space is formed between the upper wall of the outer case and the upper wall of the inner case and a plurality of separation protrusions protrude upwards on the upper wall of the inner case in the upper space, some portions of the four sidewalls are removed to form a barrier wall and an up-and-down path is formed along the removed portions, and the medium acoustic path space is formed by combining the groove unit with the up-and-down path.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
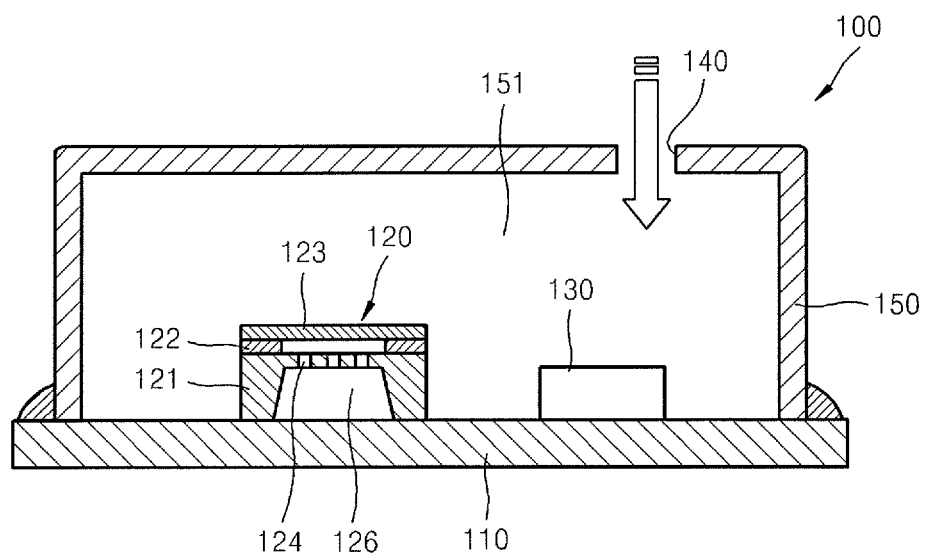
FIG. 1 is a schematic cross-sectional view of a related-art MEMS microphone.
Figure 2:
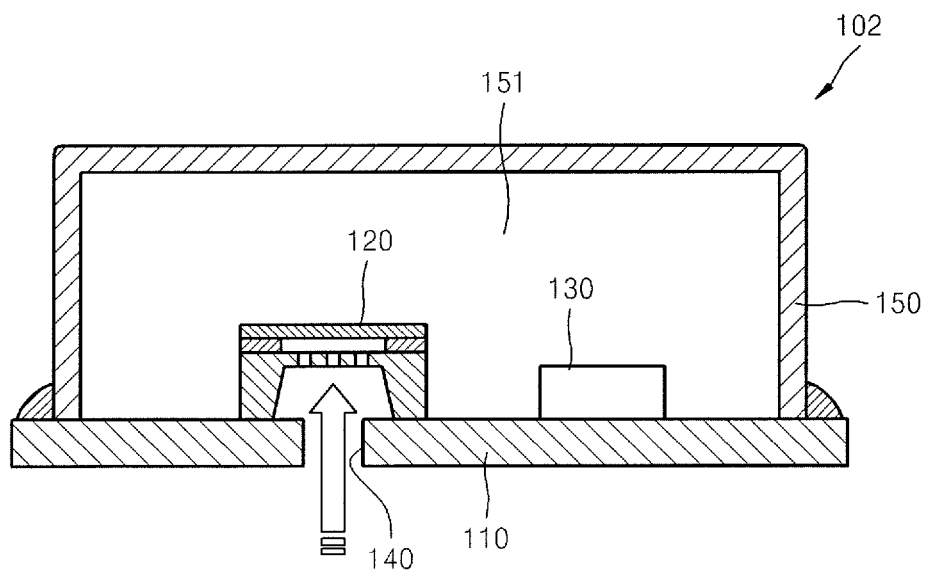
FIG. 2 is a schematic cross-sectional view of another related-art MEMS microphone.

Reference will now be made in detail to embodiments, examples of which are illustrated in the accompanying FIGS. 3 through 7.

A micro electro mechanical system (MEMS) microphone 1 according to the current embodiment is a device for converting a sound wave, such as a voice sound, an acoustic sound, or noise into an electrical signal. The MEMS microphone 1 may be used mainly in mobile phones, smart phones, and small acoustic devices, and includes a printed circuit substrate 10, a MEMS chip 20, and a case.

In the MEMS microphone 1, a sound hole through which sound enters into the MEMS microphone 1 from the outside is formed in the case. The MEMS microphone 1 is mainly used in a mobile communication device, such as a mobile phone or smart phone. However, the MEMS microphone 1 may be applied to other small electronic devices that require a small MEMS microphone.

The printed circuit substrate 10 is combined with an open lower side of the case. The printed circuit substrate 10 forms a space that is separated from an external space by being combined with the case. The space includes an inner space 31 and a medium acoustic path space 44 (refer to FIG. 5).

A substrate acoustic path 15 that connects the medium acoustic path space 44 and a MEMS inner space 22 is formed on the printed circuit substrate 10. The substrate acoustic path 15 is formed on an inner side of the printed circuit substrate 10 that is formed by stacking a plurality of layers. The printed circuit substrate 10 includes layers having through holes having appropriate shapes, and the substrate acoustic path 15 may be formed as a combination of the through holes formed in some of the layers. The printed circuit substrate 10 having the substrate acoustic path 15 may be formed by various ways.

In the current embodiment, the printed circuit substrate 10 includes a dual side printed circuit substrate 11, a cover-lay member 12, and a photo solder resist (PSR) ink member 13.

Figure 3:
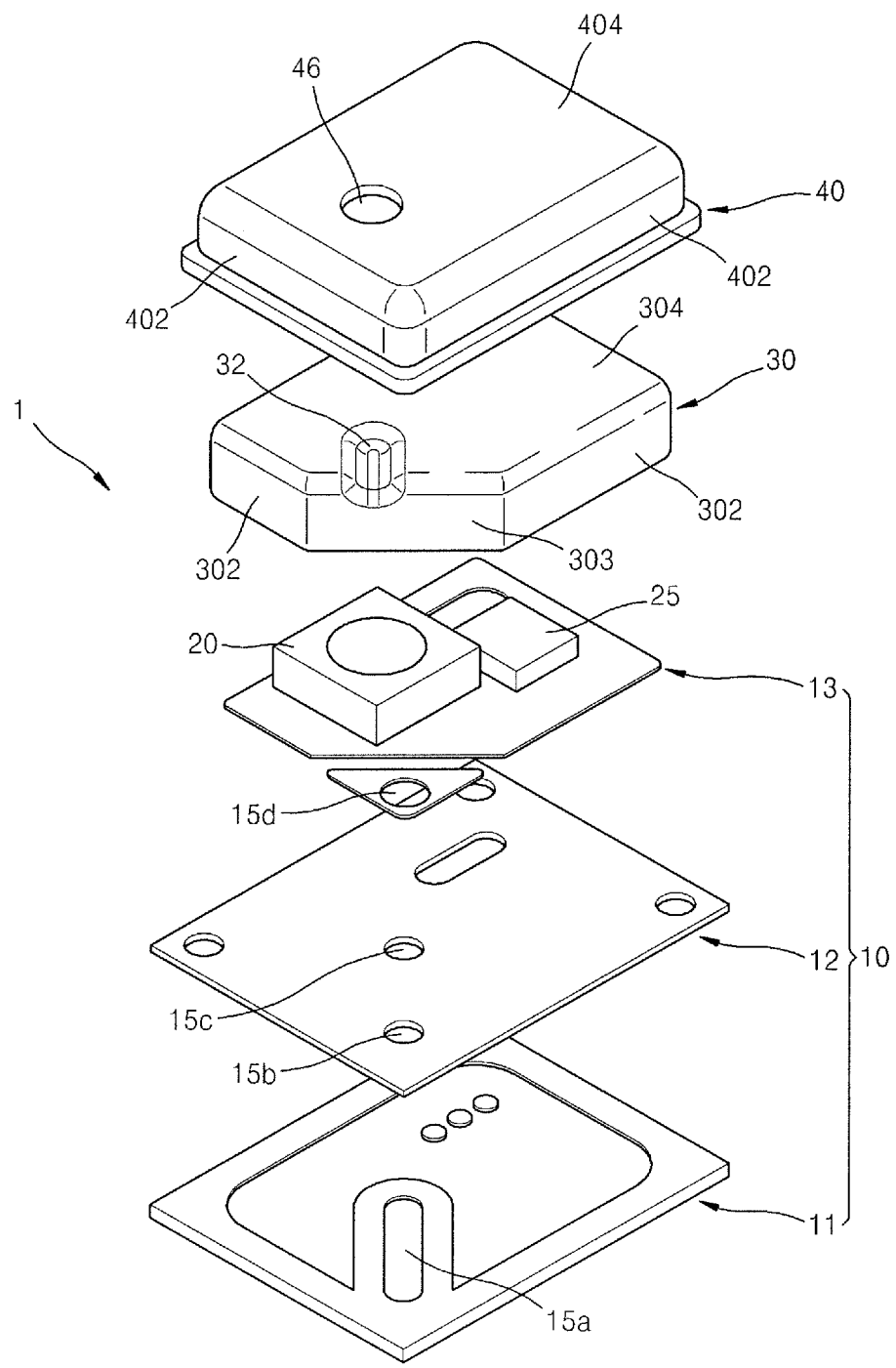
FIG. 3 is a schematic exploded perspective view of a MEMS microphone according to an embodiment of the present invention.
Figure 4:
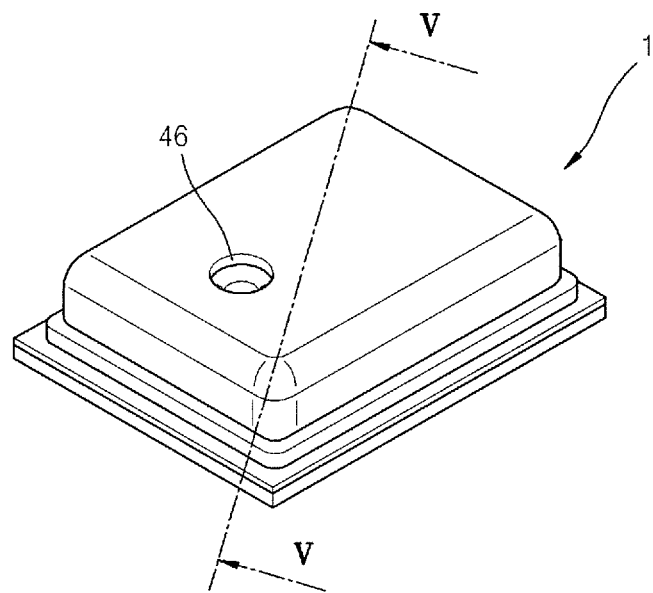
FIGS. 4 through 7 are drawings for describing the structure of the MEMS microphone of FIG. 3.
Figure 5:
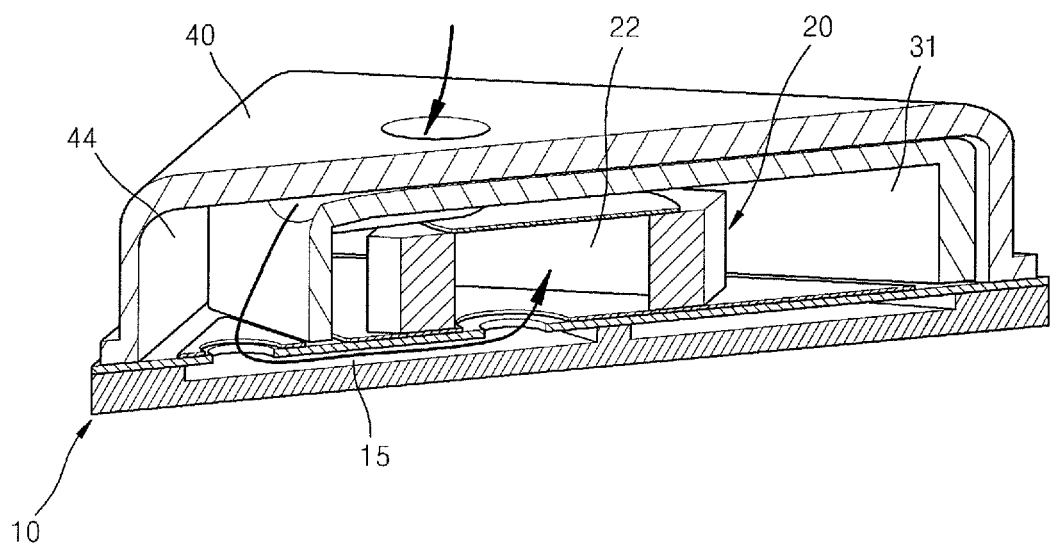

Referring to FIG. 3, the substrate acoustic path 15 is formed as a combination of a low and long shape groove 15*a* formed in the dual side printed circuit substrate 11, two holes 15*b* and 15*c* formed in the cover-lay member 12, and two holes 15*d* and 15*e* formed in the PSR ink member 13.

Electronic parts, such as a MEMS chip 20 and an amplifier 25, may be mounted on the printed circuit substrate 10 directly or via an intermediate member. The printed circuit substrate 10 is referred to as a die printed circuit substrate since various kinds of electrical parts are mounted thereon.

The MEMS chip 20 is referred to as a transducer and is included on the printed circuit substrate 10. That is, the MEMS chip 20 is directly mounted on the printed circuit substrate 10 or indirectly mounted on the printed circuit substrate 10 via another member. The MEMS chip 20 includes an empty space that is referred to as a MEMS inner space 22 (refer to FIG. 5).

An amplifier 25 is mounted on the PSR ink member 13. The amplifier 25 amplifies an electrical signal received from the MEMS chip 20. The amplifier 25 is also referred to as an ASIC chip. Although not depicted in detail, the MEMS chip 20 and the amplifier 25 are connected to each other via a wire, such as a gold bonding wire.

The case forms an inner space 31 (refer to FIG. 5) by being combined with the printed circuit substrate 10. The inner space 31 accommodates necessary electronic elements including the MEMS chip 20 and is a space separated from an external space.

The case includes an inner case 30 and an outer case 40.

The inner space 31 is formed by combining a lower edge of the inner case 30 with the printed circuit substrate 10. The outer case 40 is included to surround an outer side of the inner case 30. A lower edge of the outer case 40 is combined with the printed circuit substrate 10 to form the medium acoustic path space 44 between the inner case 30 and the outer case 40. A sound hole 46 is formed through a side of the outer case 40 so that external sound may enter the medium acoustic path space 44.

In the current embodiment, both the inner case 30 and the outer case 40 are formed of a metal. Accordingly, the inner case 30 and the outer case 40 may be formed to have a thickness smaller than when they are formed of a synthetic resin, and thus, the total volume of the case may be reduced. A lower surface of each of the inner case 30 and the outer case 40 is combined with the printed circuit substrate 10 by using a conductive adhesive 50 (refer to FIG. 7).

Unlike the related-art_case, the case according to the current embodiment is a double-type case in which the inner case 30 and the outer case 40 are separately formed and are combined with each other. Since the case is a double-type case formed of a metal and is combined with the printed circuit substrate 10 by using a conductive adhesive 50, the effect of shielding or blocking the MEMS microphone 1 from external electronic waves is higher than when a conventional single case is used.

Lower edges of rims of the inner case 30 and the outer case 40 respectively are combined with the printed circuit substrate 10. The lower edges of rims of the inner case 30 and the outer case 40 may be fixedly combined with the printed circuit substrate 10 by using a general method, for example, soldering or welding besides the conductive adhesive 50.

Also, in the current embodiment, the inner case 30 is fixed on an inner side of the outer case 40 so that the inner case 30 is forcedly inserted in the outer case 40. However, the medium acoustic path space 44 is formed between the inner case 30 and the outer case 40.

That is, although the inner case 30 is forcedly inserted in the outer case 40, an outer-side surface of the inner case 30 forms a surface contact with an inner surface of the outer case 40. However, a whole outer-side surface of the inner case 30 is not in a surface contact with the outer case 40, but a portion of the outer-side surface of the inner case 30 that is separated from the inner surface of the outer case 40 is configured so that the medium acoustic path space 44 is formed in the separated portion between the inner case 30 and the outer case 40.

More specifically, in the current embodiment, the outer case 40 includes four sidewalls 402 and an upper wall 404. The inner case 30 includes four sidewalls 302 and an upper wall 304.

A groove unit 32 is formed in the outer-side surface of the upper wall 304 of the inner case 30 to be connected to the sound hole 46. Also, some of the four sidewalls 302 of the inner case 30 are removed to form a barrier wall 303. A space formed by the barrier wall 303 forms an up-and-down path. The medium acoustic path space 44 includes both the groove unit 32 and the up-and-down path.

Both the inner case 30 and the outer case 40 have a hexahedral shape, lower surfaces of which are open, and the inner case 30 is forcedly fixed in the outer case 40. Accordingly, the inner case 30 and the outer case 40 are stably combined with each other by forcedly inserting the inner case 30 into the outer case 40 without an additional fixing member. However, a corner of the inner case 30 is removed, and the up-and-down path is formed by the removed portion of the inner case 30 and the groove unit 32 is formed by a concave portion of the upper wall 304. The up-and-down path and the groove unit 32 form the medium acoustic path space 44.

In the MEMS microphone 1 described above, external sound that flows through the sound hole 46 enters the MEMS inner space 22 after passing through the medium acoustic path space 44 that is formed by the groove unit 32 and the up-and-down path and through the substrate acoustic path 15. Since the acoustic path is formed as described above, the inner space 31 of the inner case 30 and not the MEMS inner space 22 operates as a back-chamber space, and thus, the acoustic performance of the MEMS microphone 1 may increase.

Since the case includes the inner case 30 and the outer case 40, the inner space 31 is formed by the inner case 30, and the medium acoustic path space 44 is formed between the inner case 30 and the outer case 40. There is a description that 'the case forms an inner space'. However, the description does not denote excluding the formation of the medium acoustic path space 44 that is formed by the case, but the inner space 31 and the medium acoustic path space 44 are formed by the case.

According to another embodiment, the shape of the case may be variously modified. That is, the case may have a cylindrical shape or a column shape, with a cross-sectional thereof in a horizontal direction having an oval shape or a polygonal shape. However, the case may have any shape as long as it has a double structure that includes the medium acoustic path space 44.

The MEMS microphone 1 has the following actions and effects.

In the current embodiment, the case has a double case structure having the inner case 30 and the outer case 40, the medium acoustic path space 44 is formed between the inner case 30 and the outer case 40, and the substrate acoustic path 15 is included in the printed circuit substrate 10. Therefore, the MEMS microphone 1 has a configuration in which external sound that passes through the sound hole 46 may enter the MEMS inner space 22 of the MEMS chip 20 by passing through the medium acoustic path space 44 and the substrate acoustic path 15.

In the case of a related-art MEMS microphone in which a sound hole is formed in the case, an insufficient MEMS inner space is a back chamber, and thus, the sound characteristics of the related-art MEMS microphone are not satisfactory. However, in the case of the MEMS microphone 100 according to the current embodiment, the back chamber occupies the entire inner space 31, and thus, the sound characteristics of the MEMS microphone 100 are satisfactory.

The size of the back chamber is a factor that directly affects the sound characteristics. Thus, in the current embodiment, the size of the back chamber of the MEMS microphone 1 is remarkably expanded when compared to a similar related-art MEMS microphone, and thus, the sound effect is remarkably increased.

Also, a related-art MEMS chip used in a MEMS microphone in which the sound hole is formed in the printed circuit substrate is different from a related-art MEMS chip used in a MEMS microphone in which the sound hole is formed in the case. However, according to the current embodiment, the related-art MEMS chip that is used in the MEMS microphone in which the sound hole is formed in the printed circuit substrate may be used in the MEMS microphone 100 according to an embodiment of the present invention in which the sound hole is formed in the case. That is, it is unnecessary to prepare two types of MEMS chips according to the types of the MEMS microphones.

Also, since the case is a double-type case formed of a metal, the effect of blocking or shielding the MEMS microphone 100 from external electromagnetic waves is high. Also, when the case is preassembled by insertion, a conventional method of manufacturing a MEMS microphone may be used, and thus, an entire assembling process is easy without additional costs.

Figure 6:
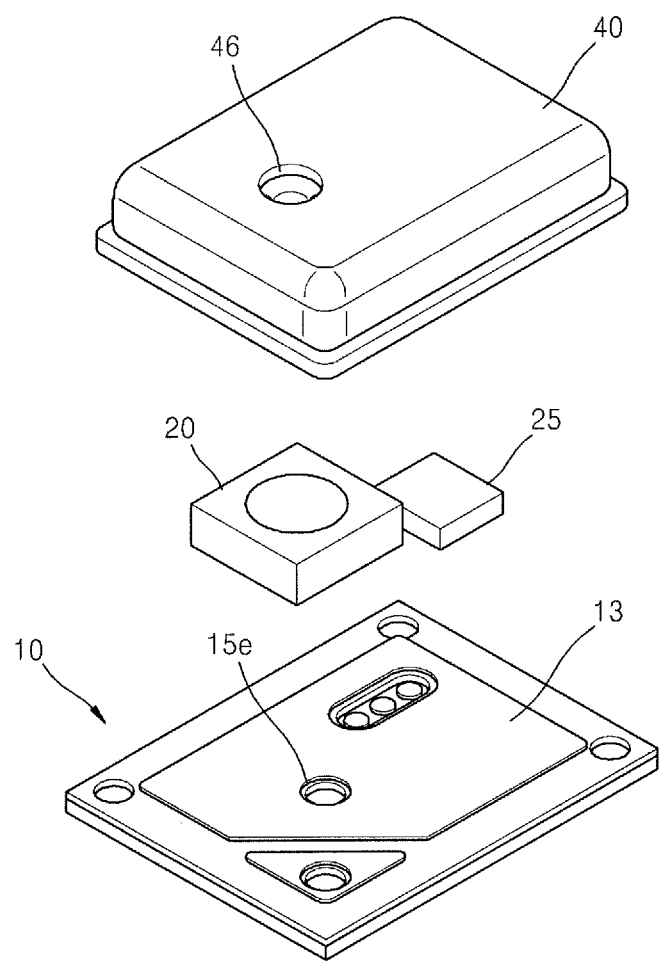
Figure 7:
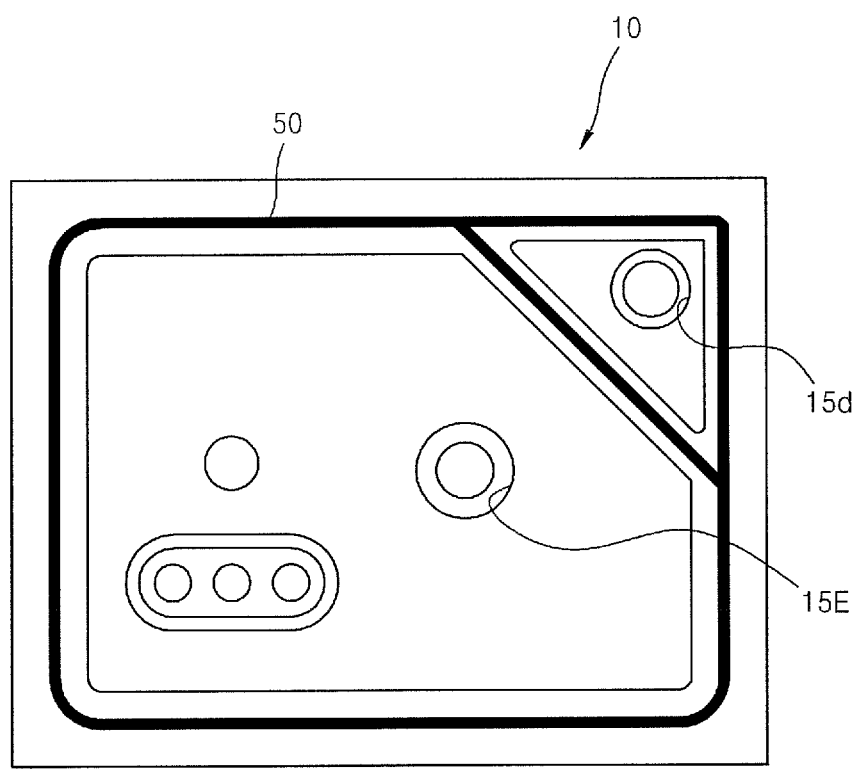

That is, as depicted in FIG. 6, after preparing the printed circuit substrate 10 and the case in which the inner case 30 and the outer case 40 are combined as depicted in FIG. 7, the conductive adhesive 50 is coated along the shape of the lower rim of the case. Afterwards, a process of locating the case is performed, and thus, an entire case assembly is completed. This method enables mass production with high productivity, and thus, the manufacturing costs are reduced.

Figure 8:
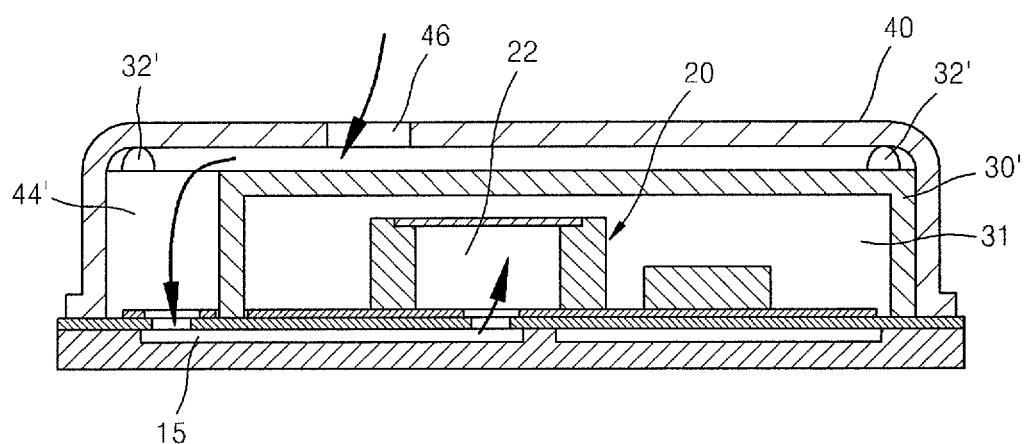
FIG. 8 is a schematic cross-sectional view of a MEMS microphone according to another embodiment of the present invention.
Figure 9:
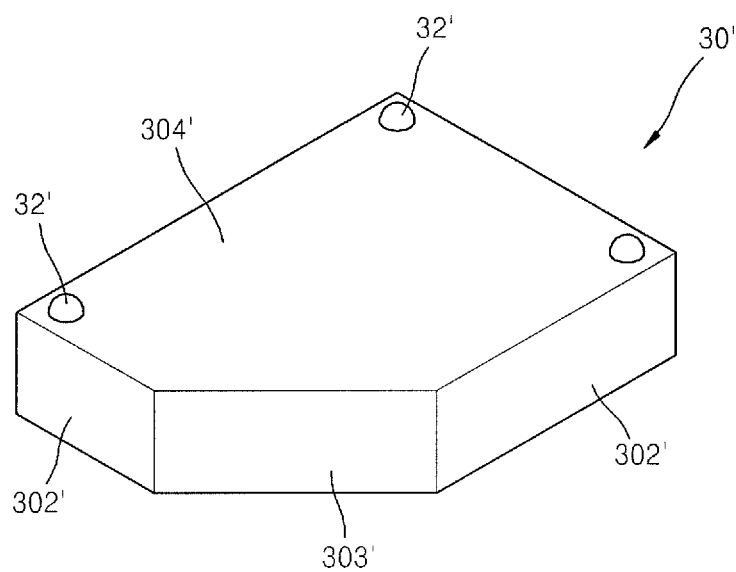
FIG. 9 is a perspective view of an inner case of the MEMS microphone of FIG. 8.

FIG. 8 is a schematic cross-sectional view of a MEMS microphone 1' according to another embodiment of the present invention. FIG. 9 is a perspective view of an inner case 30' of the MEMS microphone 1' of FIG. 8. In FIG. 8, the same reference numerals as in the previous figures are used to indicate substantially identical elements, and the descriptions thereof are omitted.

When comparing the MEMS microphone 1' according to the current embodiment to the MEMS microphone 1, the groove unit 32 is not formed in the inner case 30'. The MEMS microphone 1' is different from the MEMS microphone 1 in that a total height of the inner case 30' is reduced and separating protrusions 32' are formed on the inner case 30'.

External sound that passes through the sound hole 46 enters an empty space above an upper wall 304' formed by the separating protrusions 32', and finally enters the MEMS inner space 22 of the MEMS chip 20 after passing through the up-and-down path formed by a barrier wall 303' and the substrate acoustic path 15. A medium acoustic path space 44' includes a space above the upper wall 304' and the up-and-down path formed by the barrier wall 303'.

In the embodiments described above, the upper wall and the sidewall form an acute angle, however, the current embodiments are not limited thereto. That is, a boundary between the upper wall and the sidewall may be smooth.

It should be understood that the exemplary embodiments described therein should be considered in a descriptive sense only and not for purposes of limitation. Descriptions of features or aspects within each embodiment should typically be considered as available for other similar features or aspects in other embodiments.

Since the MEMS microphone according to the current embodiment includes an inner connection unit having an acoustic path that connects the sound hole formed in a case to an inner space of a MEMS chip, a back-chamber space is increased, and thus, the sound characteristics of the MEMS microphone are better.

According to the MEMS microphone of the current embodiment, an additional configuration process for providing a back-chamber space is unnecessary. Accordingly, since the manufacturing process is simplified, it is easy to produce the MEMS microphone of the present invention in a large scale and the manufacturing costs may be reduced.

While one or more embodiments of the present invention have been described with reference to the appended figures, it will be understood by those of ordinary skill in the art that various changes in form and details may be made therein without departing from the spirit and scope of the present invention as defined by the following claims.

What is claimed is:

1. A micro-electro mechanical system (MEMS) microphone comprising:
    a printed circuit substrate;
    a MEMS chip that is combined with the printed circuit substrate and has a MEMS inner space; and
    a case that is combined with the printed circuit substrate, accommodates the MEMS chip, and forms an inner space that is separated from an external space,
    wherein the case comprises an inner case and an outer case,
    the inner space is formed by combining a lower edge of the inner case with the printed circuit substrate,
    the outer case is formed to surround the inner case at an outside of the inner space, a lower edge thereof is combined with the printed circuit substrate so that a medium acoustic path space is formed between the inner case and the outer case, and comprises a sound hole so that external sound enters the medium acoustic path space, and
    the printed circuit substrate comprises a substrate acoustic path that connects the medium acoustic path space to the MEMS inner space of the MEMS chip so that the external sound that passes through the sound hole enters the MEMS inner space of the MEMS chip after passing through the medium acoustic path space.

2. The MEMS microphone of claim 1, wherein both the inner case and the outer case are formed of a metal.

3. The MEMS microphone of claim 2, wherein lower surfaces of the inner case and the outer case are combined with the printed circuit substrate by a conductive adhesive.

4. The MEMS microphone of claim 1, wherein the inner case is fixed in an inner space of the outer case by a forcibly fixing method.

5. The MEMS microphone of claim 1, wherein the inner case is fixed by being inserted in an inner space of the outer case, an outer surface of the inner case forms a surface contact with an inner surface of the outer case, and a portion of the outer surface of the inner case is separated from the inner surface of the outer case to form the medium acoustic path space.

6. The MEMS microphone of claim 5, wherein
    the outer case comprises four sidewalls and an upper wall,
    the inner case comprises four sidewalls and an upper wall,
    a groove unit is formed in the outer surface of the upper wall to be connected to the sound hole,
    some portions of the four sidewalls are removed to form a barrier wall and an up-and-down path is formed along the removed portions, and
    the medium acoustic path space is formed by combining the groove unit with the up-and-down path.

7. The MEMS microphone of claim 5, wherein
    the outer case comprises four sidewalls and an upper wall,
    the inner case comprises four sidewalls and an upper wall,
    an upper space is formed between the upper wall of the outer case and the upper wall of the inner case and a plurality of separation protrusions protrude upwards on the upper wall of the inner case in the upper space,
    some portions of the four sidewalls are removed to form a barrier wall and an up-and-down path is formed along the removed portions, and
    the medium acoustic path space is formed by combining the groove unit with the up-and-down path.

* * * * *